(12) United States Patent
Takahashi

(10) Patent No.: US 7,453,323 B2
(45) Date of Patent: Nov. 18, 2008

(54) CIRCUIT, CONTROL SYSTEM, IC, TRANSMITTING AND RECEIVING APPARATUS, CONTROL METHOD AND PROGRAM

(75) Inventor: Masayuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 152 days.

(21) Appl. No.: 11/419,527

(22) Filed: May 22, 2006

(65) Prior Publication Data

US 2006/0269032 A1 Nov. 30, 2006

(30) Foreign Application Priority Data

May 25, 2005 (JP) ............................. 2005/152430

(51) Int. Cl.
*H03L 7/00* (2006.01)
(52) U.S. Cl. ............................................ 331/2; 331/10
(58) Field of Classification Search .................. 331/2, 331/10
See application file for complete search history.

(56) References Cited

U.S. PATENT DOCUMENTS

| 5,128,633 A | 7/1992 | Martin et al. |
| 6,674,332 B1 | 1/2004 | Wunner et al. |
| 2002/0118069 A1* | 8/2002 | Fujiwara et al. ................. 331/2 |
| 2003/0119466 A1 | 6/2003 | Goldman |
| 2004/0105516 A1 | 6/2004 | Smith et al. |

FOREIGN PATENT DOCUMENTS

JP 2000-278126 10/2000

OTHER PUBLICATIONS

Search report of search conducted on Sep. 14, 2006 by the Patent Office of the United Kingdom.

* cited by examiner

*Primary Examiner*—Joseph Chang
(74) *Attorney, Agent, or Firm*—Whitham Curtis Christofferson & Cook, P.C.

(57) ABSTRACT

The present invention provides a circuit, a control system, an IC, a transmitting and receiving apparatus, a control method, and a program which can reduce a phase error and simultaneously suppress a high-frequency jitter component and a low-frequency wander component. A PLL1 unit which is a high-frequency jitter suppression unit, a PLL2 unit which is a low-frequency wander suppression unit, and a PLL3 unit which is a reproduction clock unit are connected to form a multiloop synthesizer configuration.

12 Claims, 10 Drawing Sheets

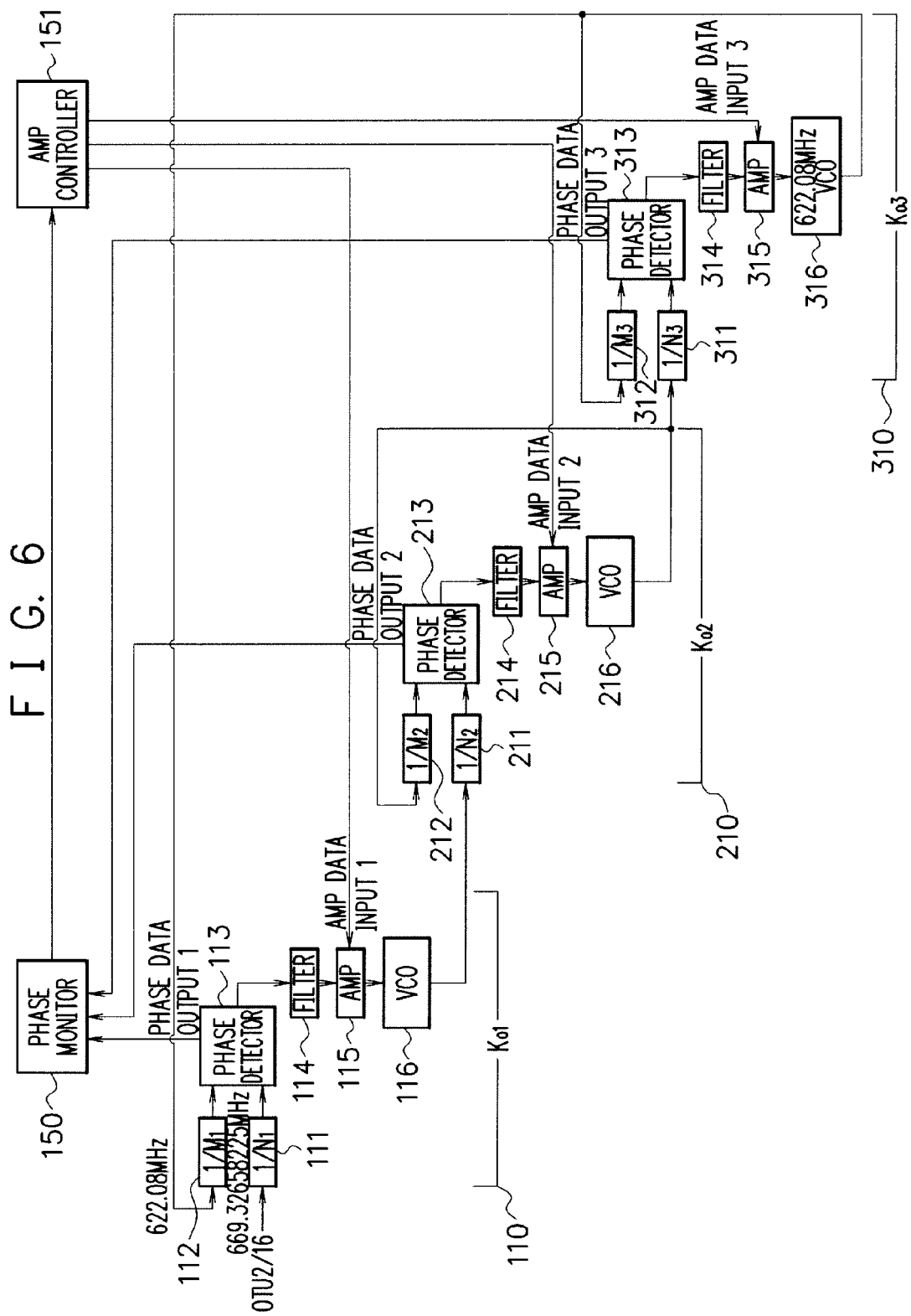
F I G. 6

FIG. 9
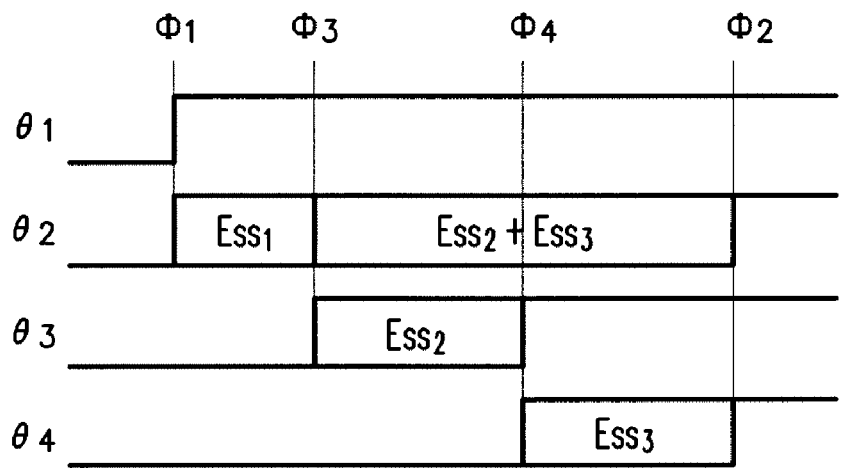
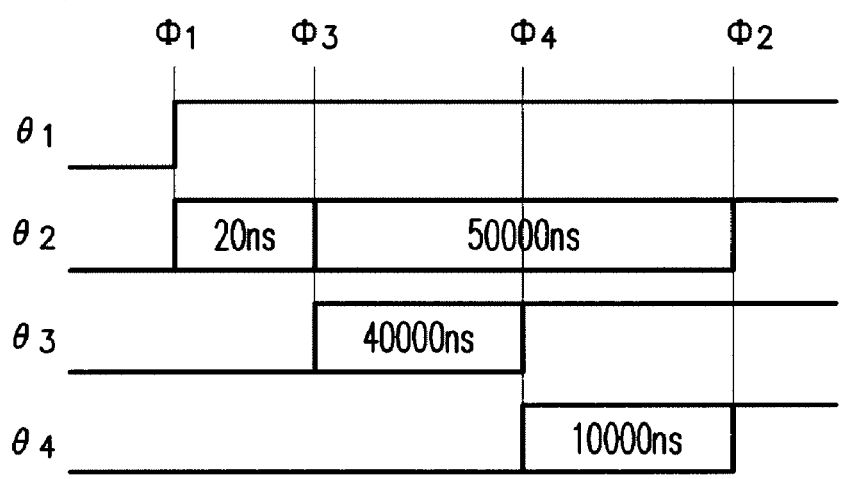

FIG. 10

STABLE CONDITIONS IN MULTILOOP

| PARAMETER | MULTILOOP NO. | LOOP1 (MULTILOOP) | LOOP2 | LOOP3 |
|---|---|---|---|---|
| DIRECT-CURRENT LOOP GAIN | $K_o$ | $K_{o1}$ | $K_{o2}$ | $K_{o3}$ |
| PHASE COMPARISON PERIOD | $P_{CT}$ | $P_{CT1}$ | $P_{CT2}$ | $P_{CT2}$ |
| STATIC PHASE ERROR | $E_{ss}$ | $E_{ss_1} = \Delta\omega / K_{o1}$ | $E_{ss_2} = \Delta\omega / K_{o2}$ | $E_{ss_3} = \Delta\omega / K_{o3}$ |
| STABLE CONDITION | | $P_{C_{T1}} \geq E_{ss_1} + E_{ss_2} + E_{ss_3}$ | $P_{C_{T2}} \geq E_{ss_2}$ | $P_{C_{T3}} \geq E_{ss_3}$ |

SPECIFIC EXAMPLE OF STABLE CONDITIONS

| PARAMETER | MULTILOOP NO. | LOOP1 (MULTILOOP) | LOOP2 | LOOP3 |
|---|---|---|---|---|
| DIRECT-CURRENT LOOP GAIN | $K_o$ | 1000 | 0.5 | 2 |
| PHASE COMPARISON PERIOD | $P_{CT}$ | 3us | 125us | 125us |
| STATIC PHASE ERROR | $E_{ss}$ | 20ns=20ppm/1000 | 40us=20ppm/0.5 | 10us=20ppm/2 |
| STABLE CONDITION | | 3us >= 20ns+40us+10us | 125us >= 40us | 125us >= 40us |

SINCE MULTILOOP IS NOT STABILIZED IN THE ABOVE STABLE CONDITION, PROCESS IN WHICH PHASE ERROR SATISFIES STABLE CONDITION IS PERFORMED BY CIRCUIT BLOCK OR PROCESS FLOW SHOWN IN FIGS. 4 AND 5

3us >= 1.2ns + 2399ns + 599.8ns

CIRCUIT, CONTROL SYSTEM, IC, TRANSMITTING AND RECEIVING APPARATUS, CONTROL METHOD AND PROGRAM

BACKGROUND OF THE INVENTION

1. Field of the Invention

The present invention relates to a circuit, a control system, an IC (Integrated Circuit), a transmitting and receiving apparatus, a control method, and a program that reduce a phase error and simultaneously suppress a high-frequency jitter component and a low-frequency wander component.

2. Description of the Related Art

Conventionally, there is widely used a PLL (Phase Locked Loop) circuit which reproduces a clock of an SDH (Synchronous Digital Hierarchy) signal from an OTN (Optical Transport Network) signal.

For example, Japanese Patent Application Laid-Open No. 2000-278126 proposes a technique to provide a PLL circuit. In this document, the PLL circuit includes two kinds of phase comparators. The higher accuracy phase comparator is selected depending on magnitude of a phase difference between an input signal and an oscillator output and the output of the higher accuracy phase comparator is led to a loop filter to obtain high frequency accuracy and phase accuracy. Also, the input signal or a signal obtained by dividing the input signal is used as a signal source of a sampling frequency of the loop filter, and the high-speed response is obtained over a wide frequency band by causing a characteristic frequency of the loop filter to follow a frequency increase or decrease of the input signal. Also, using a numerical control oscillator, continuous and high-speed frequency change is enabled in a wide input frequency range and a good transient response is obtained. Further, when a phase difference is remarkably large between the input signal and the oscillator output, namely, when the PLL circuit is unlocked, a detection value of an input signal frequency is set at an output frequency of an oscillator to improve a follow-up speed at the large frequency change of the input signal, and thereby the high accuracy and high-speed response are obtained with a simple configuration over a wide input frequency range.

However, there are the following problems in the PLL circuit proposed in Japanese Patent Application Laid-Open No. 2000-278126.

When the SDH signal clock is reproduced from the OTN signal, both a high-frequency jitter component and a low-frequency wander component are generated due to asynchronous stuff multiplex. Two problems arise for a high-frequency jitter suppression circuit and a low-frequency wander suppression circuit.

The first problem is cost increase. In order to suppress the low-frequency wander component generated when an SDH signal clock is reproduced from the OTN signal, it is necessary that a phase noise cutoff frequency of the PLL circuit be set in the range of about 0.1 Hz to about 1 Hz. In this case, because a phase error is increased, it is necessary that the suppression of the low-frequency wander component be realized by a complete integral type PLL circuit having a large circuit scale as shown in FIG. 1, which leads to the cost increase. When the cutoff frequency is set at a low frequency, a pull-out/lock range, which is a dynamic range and is different from a hold-in/pull-in range of a static range, is narrowed so that function of suppressing the high-frequency jitter component decreases.

That is, when the high-frequency jitter component exceeding the pull-out/lock range of PLL is inputted, although the high-frequency jitter component is suppressed, the jitter component that is not controlled in the pull-out/lock range is superposed every PLL control cycle (natural angular frequency), which generates the new jitter and wander components.

Specifically, when the cutoff frequency is set in the range of about 0.08 Hz to 0.1 Hz, a direct-current loop gain is about 0.5. For example, when a high-frequency jitter component of 1000 ns is inputted, an amount of frequency fluctuation is computed at 0.5 ppm from a phase fluctuation angle ($\phi=\Delta\omega$/direct-current loop gain). This means that a pull-out/lock range needs to be 0.5 ppm or more in theory. However, when the cutoff frequency is set in the range of about 0.08 Hz to 0.1 Hz, it is actually difficult to keep the pull-out/lock range 0.5 ppm or more.

More specifically, the pull-out/lock range ($\Delta\omega pL$) can be computed from the direct-current loop gain and a phase comparison frequency. At this point, because one frame period of 328 kHz of an OTU2 signal becomes the phase comparison frequency, the frequency-converted pull-out/lock range is computed as $(0.5/2\pi)/328$ kHz=0.2426 ppm from $\Delta\omega pL=Ko=0.5$. Therefore, a design condition when a high-frequency jitter component of 1000 ns is inputted, namely a condition that the pull-out/lock range is not lower than 0.5 ppm, cannot be satisfied.

Accordingly, in theory, it is difficult to suppress both the high-frequency jitter component and the low-frequency wander component simultaneously only by one stage of the complete integral type PLL circuit shown in FIG. 1.

Another problem is superposition of a phase error Ess (Steady State Error). In order to avoid the problem of the cost increase, for example, when the multiple-stage connection is realized by small scale incomplete integral type PLL circuits including high-frequency jitter suppression circuits and low-frequency wander suppression circuits as shown in FIG. 2, although the high-frequency jitter component and the low-frequency wander component can simultaneously be suppressed, the phase error Ess generated in each PLL circuit is superposed at the same time.

The superposition of the phase error Ess can be understood with Formula 1.

$$Ess_{Multiloop} = \frac{\Delta\omega}{K_{o1}} \qquad \text{[Formula 1]}$$

$$Ess_{Cascade} = \frac{\Delta\omega}{K_{o1}} + \frac{\Delta\omega}{K_{o2}} + \frac{\Delta\omega}{K_{o3}}$$

Accordingly, the phase error increases as the number of multiple-stage connections increases, so that the multiple-stage connection is hardly realized with the conventional incomplete integral type PLL circuit.

SUMMARY OF THE INVENTION

In view of the above problem, the present invention aims to provide a circuit, a control system, an IC, a transmitting and receiving apparatus, a control method, and a program that can reduce the phase error and simultaneously suppress the high-frequency jitter component and the low-frequency wander component.

According to a first aspect of the invention, a circuit comprises a first PLL unit which is a high-frequency jitter suppression unit, a second PLL unit which is a low-frequency wander suppression unit, and a third PLL unit which is a reproduction clock unit, wherein the first to third PLL units are connected to form a multiloop synthesizer configuration.

According to a second aspect of the invention, a circuit is provided in which the first PLL unit comprises a first 1/N unit which divides a reference clock into a phase comparison frequency, a first 1/M unit which divides a multiloop clock from the third PLL unit into the phase comparison frequency, a first phase detector unit which performs a phase comparison process, a first amplifier unit which amplifies a direct-current component, and a first VCO (Voltage Controlled Oscillator) unit which controls an output frequency by a direct-current signal, the second PLL unit comprises a second 1/N unit which divides a signal from the first PLL unit into the phase comparison frequency, a second 1/M unit which divides a generation clock of the second PLL unit into the phase comparison frequency, a second phase detector unit which performs the phase comparison process, a second amplifier unit which amplifies the direct-current component, and a second VCO unit which controls the output frequency by the direct-current signal, and the third PLL unit comprises a third 1/N unit which divides a signal from the second PLL unit into the phase comparison frequency, a third 1/M unit which divides a generation clock of the third PLL unit into the phase comparison frequency, a third phase detector unit which performs the phase comparison process, a third amplifier unit which amplifies the direct-current component, and a third VCO unit which controls the output frequency by the direct-current signal.

According to a third aspect of the invention, a circuit further comprises a phase monitor unit which monitors phase states of the first PLL unit, the second PLL unit, and the third PLL unit, and an amplifier controller unit which sets an optimum amplifier gain constant based on phase state information from the phase monitor unit, wherein, when the amplifier controller unit determines that a phase error of the whole multiloop is equal or more than a phase comparison period of the first phase detector unit by comparing the phase error to the phase comparison period based on the phase state information from the phase monitor unit, an amplifier gain constant is computed in a range where the phase error of the whole multiloop does not exceed the phase comparison period, and the amplifier gain constant is set at the first amplifier unit, the second amplifier unit, and the third amplifier unit.

According to a fourth aspect of the invention, a control system comprises a first PLL unit which is a high-frequency jitter suppression unit, a second PLL unit which is a low-frequency wander suppression unit, and a third PLL unit which is a reproduction clock unit, wherein the first to third PLL units are formed in a multiloop synthesizer configuration.

According to a fifth aspect of the invention, a control system is provided in which the first PLL unit includes a first 1/N unit which divides a reference clock into a phase comparison frequency, a first 1/M unit which divides a multiloop clock from the third PLL unit into the phase comparison frequency, a first phase detector unit which performs a phase comparison process, a first amplifier unit which amplifies a direct-current component, and a first VCO unit which controls an output frequency by a direct-current signal, the second PLL unit includes a second 1/N unit which divides a signal from the first PLL unit into the phase comparison frequency, a second 1/M unit which divides a generation clock of the second PLL unit into the phase comparison frequency, a second phase detector unit which performs the phase comparison process, a second amplifier unit which amplifies the direct-current component, and a second VCO unit which controls the output frequency by the direct-current signal, and the third PLL unit includes a third 1/N unit which divides a signal from the second PLL unit into the phase comparison frequency, a third 1/M unit which divides a generation clock of the third PLL unit into the phase comparison frequency, a third phase detector unit which performs the phase comparison process, a third amplifier unit which amplifies the direct-current component, and a third VCO unit which controls the output frequency by the direct-current signal.

According to a sixth aspect of the invention, the control system further includes a phase monitor unit which monitors phase states of the first PLL unit, the second PLL unit, and the third PLL unit, and an amplifier controller unit which sets an optimum amplifier gain constant based on phase state information from the phase monitor unit, wherein, when the amplifier controller unit determines that a phase error of the whole multiloop is equal or more than a phase comparison period of the first phase detector unit by comparing the phase error to the phase comparison period based on the phase state information from the phase monitor unit, an amplifier gain constant is computed in a range where the phase error of the whole multiloop does not exceed the phase comparison period, and the amplifier gain constant is set at the first amplifier unit, the second amplifier unit, and the third amplifier unit.

According to a seventh aspect of the invention, an IC includes the circuit described in any one of the first to third aspects. According to an eighth aspect of the invention, a transmitting and receiving apparatus includes the circuit described in any one of the first to third aspects.

According to a ninth aspect of the invention, a control method is provided under a multiloop synthesizer configuration which comprises a first PLL unit which is a high-frequency jitter suppression unit, a second PLL unit which is a low-frequency wander suppression unit, and a third PLL unit which is a reproduction clock unit, the first to third PLL units. The method for the first PLL unit comprises the steps of dividing a reference clock into a phase comparison frequency with a first 1/N unit; dividing a multiloop clock from the third PLL unit into the phase comparison frequency with a first 1/M unit; performing a phase comparison process with a first phase detector unit; amplifying a direct-current component with a first amplifier unit; and controlling an output frequency by a direct-current signal with a first VCO unit. The method for the second PLL unit comprises the steps of dividing a signal from the first PLL unit into the phase comparison frequency with a second 1/N unit; dividing a generation clock of the second PLL unit into the phase comparison frequency with a second 1/M unit; performing the phase comparison process with a second phase detector unit; amplifying the direct-current component with a second amplifier unit; and controlling the output frequency by the direct-current signal with a second VCO unit, and the third PLL unit includes dividing a signal from the second PLL unit into the phase comparison frequency with a third 1/N unit; dividing a generation clock of the third PLL unit into the phase comparison frequency with a third 1/M unit; performing the phase comparison process with a third phase detector unit; amplifying the direct-current component with a third amplifier unit; and controlling the output frequency by the direct-current signal with a third VCO unit.

According to a tenth aspect of the invention, the control method is provided under the multiloop synthesizer configuration which further comprises a phase monitor unit which monitors phase states of the first PLL unit, the second PLL unit, and the third PLL unit, and an amplifier controller unit which sets an optimum amplifier gain constant based on phase state information from the phase monitor unit. When the amplifier controller unit determines that a phase error of the whole multiloop is equal or more than a phase comparison period of the first phase detector unit by comparing the phase error to the phase comparison period based on the phase state information from the phase monitor unit, an amplifier gain constant is computed in a range where the phase error of the whole multiloop does not exceed the phase comparison period, and the amplifier gain constant is set at the first amplifier unit, the second amplifier unit, and the third amplifier unit.

According to an eleventh aspect of the invention, a program is provided for a first PLL unit being a high-frequency jitter suppression unit, a second PLL unit being a low-frequency wander suppression unit, a third PLL unit being a reproduction clock unit where the first to third PLL units are connected to form a multiloop synthesizer configuration. The program causes the first PLL unit to execute the following: dividing a reference clock into a phase comparison frequency with a first 1/N unit; dividing a multiloop clock from the third PLL unit into the phase comparison frequency with a first 1/M unit; performing a phase comparison process with a first phase detector unit; amplifying a direct-current component with a first amplifier unit; and controlling an output frequency by a direct-current signal with a first VCO unit. The program also causes the second PLL unit to execute the following: dividing a signal from the first PLL unit into the phase comparison frequency with a second 1/N unit; dividing a generation clock of the second PLL unit into the phase comparison frequency with a second 1/M unit; performing the phase comparison process with a second phase detector unit; amplifying the direct-current component with a second amplifier unit; and controlling the output frequency by the direct-current signal with a second VCO unit. The program also causes the third PLL unit to execute the following: dividing a signal from the second PLL unit into the phase comparison frequency with a third 1/N unit; dividing a generation clock of the third PLL unit into the phase comparison frequency with a third 1/M unit; performing the phase comparison process with a third phase detector unit; amplifying the direct-current component with a third amplifier unit; and controlling the output frequency by the direct-current signal with a third VCO unit.

According to a twelfth aspect of the invention, the program causes an amplifier controller unit to execute a process in which an amplifier gain constant is computed in a range where a phase error of the whole multiloop does not exceed a phase comparison period and the amplifier gain constant is set at the first amplifier unit, the second amplifier unit, and the third amplifier unit, when the amplifier controller unit determines that the phase error of the whole multiloop is equal or more than the phase comparison period of the first phase detector unit by comparing the phase error to the phase comparison period based on phase state information from a phase monitor unit which monitors phase states of the first PLL unit, the second PLL unit, and the third PLL unit.

According to the circuit, the control system, the IC, the transmitting and receiving apparatus, the control method, and the program, the phase error can be reduced, and the high-frequency jitter component and the low-frequency wander component can simultaneously be suppressed.

BRIEF DESCRIPTION OF THE DRAWINGS

The objects and features of the present invention will become more apparent from the consideration of the following detailed description taken in conjunction with the accompanying drawings in which:

FIG. 6 is a schematic diagram of a PLL circuit according to a second embodiment of the invention;

FIG. 9 shows a phase relationship when an input frequency of the PLL circuit is rapidly changed; and FIG. 10 shows an example of parameters.

DESCRIPTION OF THE PREFERRED EMBODIMENT

A first embodiment of the invention will be described in detail with reference to the drawings.

Figure 3:
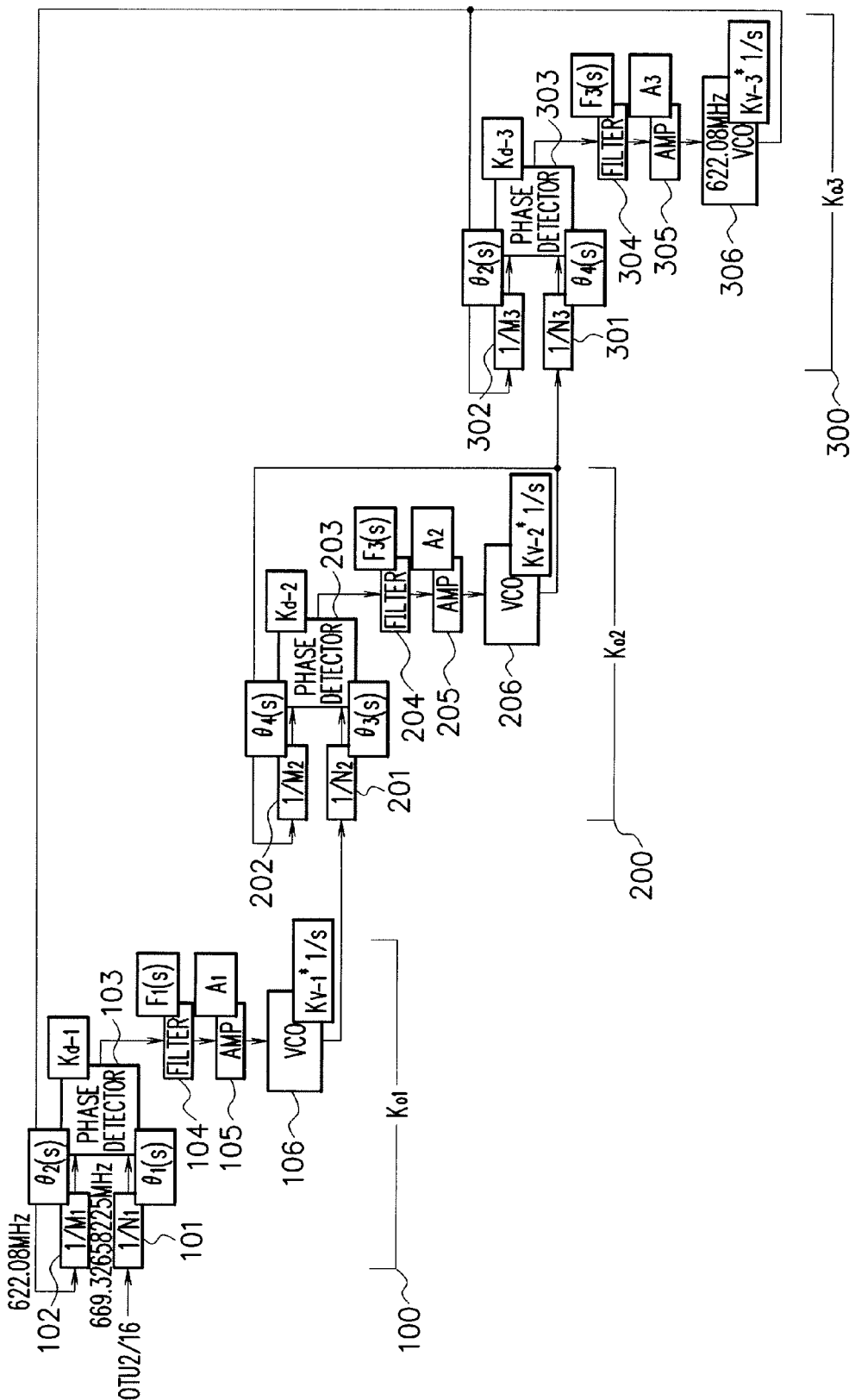
FIG. 3 is a schematic diagram of a PLL circuit according to a first embodiment of the invention.

Referring to FIG. 3, a circuit according to the first embodiment reproduces the clock of the SDH (Synchronous Digital Hierarchy) signal from the OTN (Optical Transport Network) signal. The circuit includes a PLL1 unit 100, which is a high-frequency jitter suppression unit, a PLL2 unit 200, which is a low-frequency wander suppression unit, and a PLL3 unit 300, which is a SDH signal reproduction clock unit. All the PLL units are realized with a small incomplete integral type circuit.

The PLL1 unit 100 includes a 1/N unit 101, a 1/M unit 102, a phase detector unit 103, a filter unit 104, an amplifier unit 105, and a VCO (Voltage Controlled Oscillator) unit 106. The 1/N unit 101 divides a signal (669.32658225 MHz) into a phase comparison frequency, the signal being obtained by dividing by 16 a clock (10.709225316 MHz) of an OTU2 (Optical Transport Unit 2) signal. The 1/M unit 102 divides a 622.08-MHz clock into the phase comparison frequency, the clock being a multiloop clock from the PLL3 unit 300. The phase detector unit 103 performs a phase comparison process. The filter unit 104 performs a filtering process. The amplifier unit 105 amplifies a direct-current component. The VCO unit 106 controls an output frequency by a direct-current signal.

The PLL2 unit 200 includes a 1/N unit 201, a 1/M unit 202, a phase detector unit 203, a filter unit 204, an amplifier unit 205, and a VCO unit 206. The 1/N unit 201 divides the signal from the PLL1 unit 100 into the phase comparison frequency. The 1/M unit 202 divides a generation clock of the PLL2 unit 200 into the phase comparison frequency. The phase detector unit 203 performs the phase comparison process. The filter unit 204 performs the filtering process. The amplifier unit 205 amplifies the direct-current component. The VCO unit 206 controls the output frequency by the direct-current signal.

The PLL3 unit 300 includes a 1/N unit 301, a 1/M unit 302, a phase detector unit 303, a filter unit 304, an amplifier unit 305, and a VCO unit 306. The 1/N unit 301 divides the signal from the PLL2 unit 200 into the phase comparison frequency. The 1/M unit 302 divides the generation clock of the PLL3 unit 300 into the phase comparison frequency. The phase detector unit 303 performs the phase comparison process. The filter unit 304 performs the filtering process. The amplifier unit 305 amplifies the direct-current component. The VCO unit 306 controls the output frequency by the direct-current signal.

Each block will be described in detail. The 1/N unit 101, the 1/M unit 102, the 1/N unit 201, the 1/M unit 202, the 1/N unit 301, and the 1/M unit 302 are all frequency dividers and self-synchronizing type frequency-dividing counters.

The phase detector unit 103, the phase detector unit 203, and the phase detector unit 303 are phase comparators. Examples of the phase comparator include an exclusive-OR type, a set-reset flip flop type or the like. Any type of phase comparator may be used.

The filter unit 104, the filter unit 204, and the filter unit 304 are incomplete integral type filters. Specifically, for example, the filter unit 104, the filter unit 204, and the filter unit 304 are not an expensive complete integral type active filter, which is hardly realized, but an inexpensive lag-lead filter, which can easily be realized.

The amplifier unit 105, the amplifier unit 205, and the amplifier unit 305 are amplifiers. Specifically, for example, the amplifier unit 105, the amplifier unit 205, and the amplifier unit 305 are an inexpensive inverting amplifier or noninverting amplifier using an operational amplifier, which can be easily realized.

The VCO unit 106, the VCO unit 206, and the VCO unit 306 are voltage controlled oscillators. Specifically, for example, the VCO unit 106, the VCO unit 206, and the VCO unit 306 are an inexpensive voltage control type quartz oscillator.

Then, a process operation flow of the PLL circuit in the first embodiment will be described.

The description is given with a Laplace equation.

Direct-current loop gains of the PLL circuits are set at Ko1, Ko2, and Ko3, respectively. An input phase of a reference signal is set at θ1(s) and an input phase of a PLL circuit reproduction signal is set at θ2(s) in the PLL1 unit 100, an input phase of the reference signal is set at θ3(s) and an input phase of the PLL circuit reproduction signal is set at θ4(s) in the PLL2 unit 200, and an input phase of the reference signal is set at θ4(s) and an input phase of the PLL circuit reproduction signal is set at θ2(s) in the PLL3 unit 300. Then, the following phase relationship holds.

$$\theta_3(s) = (\theta_1(s) - \theta_2(s)) \cdot K_{o1}$$

$$\theta_4(s) = (\theta_3(s) - \theta_4(s)) \cdot K_{o2}$$

$$\theta_2(s) = (\theta_4(s) - \theta_2(s)) \cdot K_{o3} \quad \text{[Formula 2]}$$

At this point, the input phase of the whole multiloop is θ1(s) and the output phase of the whole multiloop is θ2, so that a closed-loop transfer function H(s) of the whole multiloop is expressed by Formula 3.

$$H(s) = \frac{\theta_2(s)}{\theta_1(s)} = \frac{K_{o1} \cdot K_{o2} \cdot K_{o3}}{s^3 + (K_{o2} + K_{o3})s^2 + (K_{o2} \cdot K_{o3})s + K_{o1} \cdot K_{o2} \cdot K_{o3}} \quad \text{[Formula 3]}$$

An open-loop transfer function G(s) is computed as follows:

$$G(s) = \frac{H(s)}{1 - H(s)} = \frac{K_{o1} \cdot K_{o2} \cdot K_{o3}}{s^3 + (K_{o2} + K_{o3})s^2 + (K_{o2} \cdot K_{o3})s} \quad \text{[Formula 4]}$$

Figure 4:
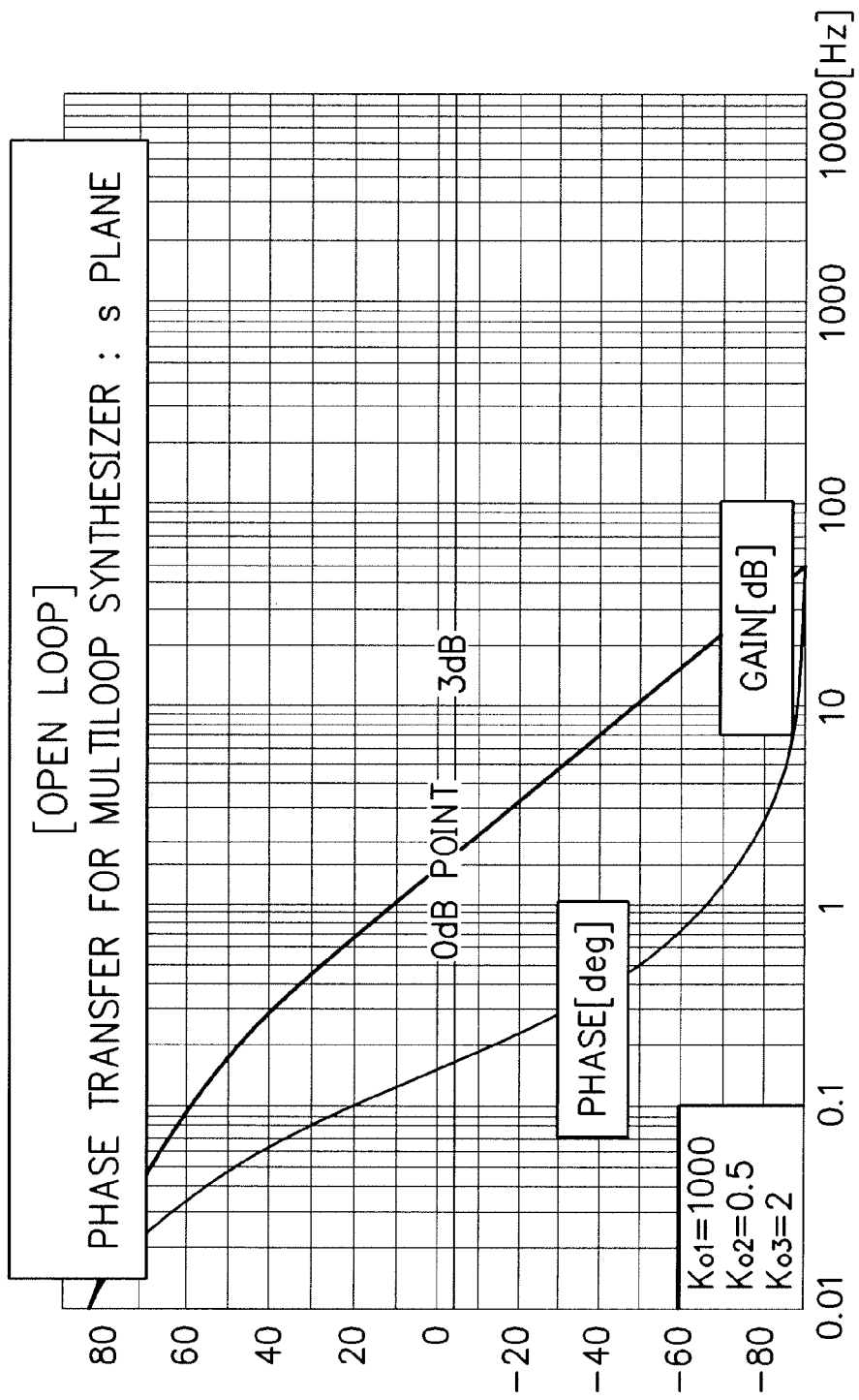
FIG. 4 shows open loop characteristics on a Laplace plane in the first embodiment of the invention.
Figure 5:
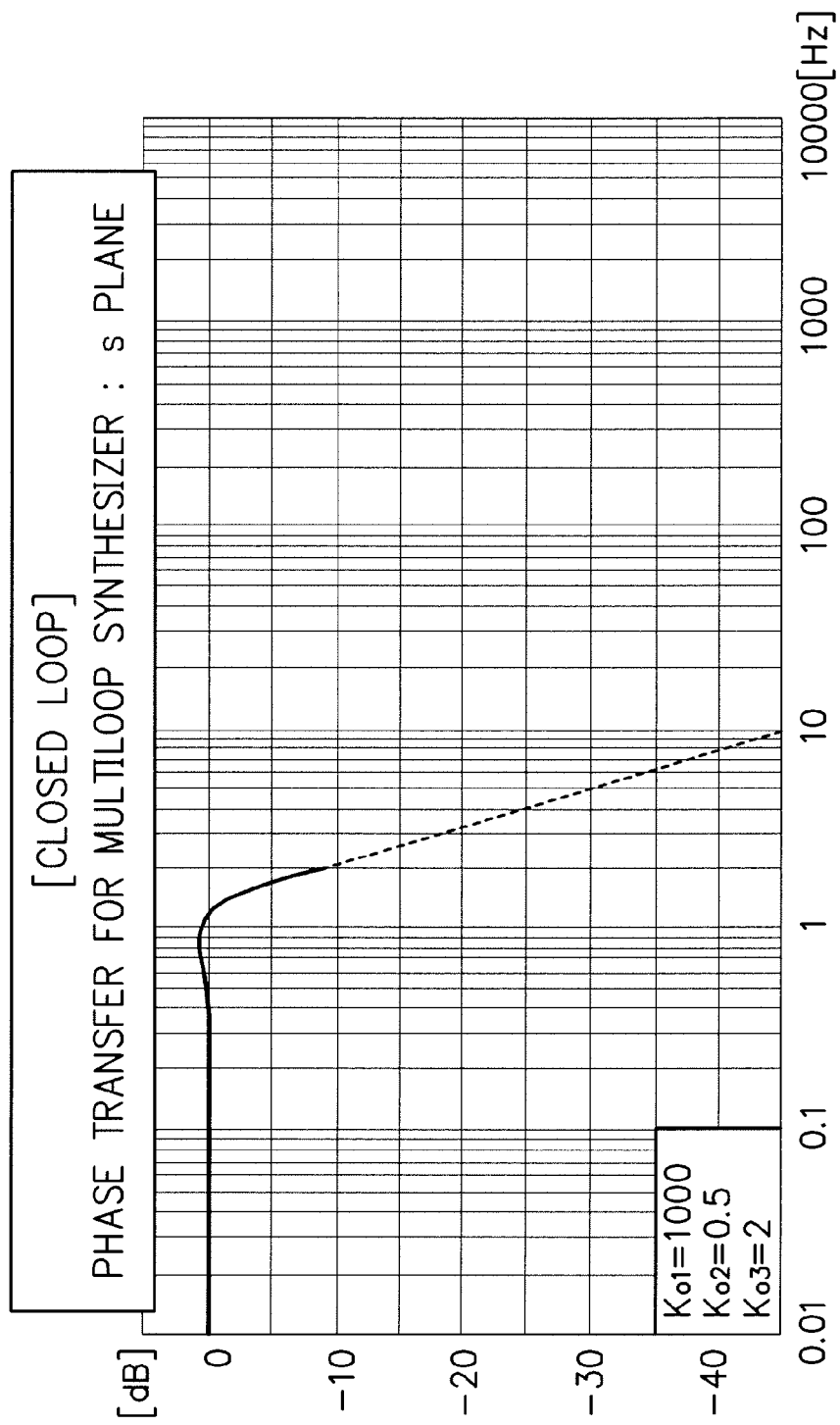
FIG. 5 shows closed loop characteristics on the Laplace plane in the first embodiment of the invention.

FIGS. 4 and 5 show open-loop characteristics and closed-loop characteristics on a Laplace plane where Ko1 is set at "1000" in order to set the high-frequency jitter suppression frequency of the PLL1 unit 100 at about 160 Hz, Ko2 is set at "0.5" in order to set the low-frequency wander suppression frequency of the PLL2 unit 200 at about 0.08 Hz, and Ko3 of the PLL3 unit 300 is set at "2".

Referring to FIG. 4, a phase margin not lower than 90 degrees and a gain margin not more than −80 dB can be secured based on the open-loop transfer characteristics shown in FIG. 4, and this means that the system is in a stable state as a whole.

Referring to FIG. 5, the cutoff frequency of the whole multiloop is around 1 Hz based on the closed-loop transfer characteristics shown in FIG. 5, and the high-frequency jitter component and the low-frequency wander component can sufficiently be removed.

Similarly, a phase error Ess of the whole multiloop is computed as follows:

$$\begin{aligned} Ess_{Multiloop} &= \lim_{t \to \infty} \phi(t) \quad \text{[Formula 5]} \\ &= \lim_{s \to 0} s \cdot \phi(s) \\ &= \lim_{s \to 0} s \cdot [1 - H(s)] \cdot \theta_1(s) \\ &= \frac{s^4 + (K_{o2} + K_{o3})s^3 + (K_{o2} + K_{o3})s^2}{s^3 + (K_{o2} + K_{o3})s^2 + (K_{o2} \cdot K_{o3})s + K_{o1} \cdot K_{o2} \cdot K_{o3}} \cdot \frac{\Delta \omega}{s^2} \\ &= \frac{K_{o2} \cdot K_{o3}}{K_{o1} \cdot K_{o2} \cdot K_{o3}} \cdot \Delta \omega \\ &= \frac{\Delta \omega}{K_{o1}} \end{aligned}$$

As can be seen from Formula 5, because only the direct-current loop gain Ko1 remains as a direct-current loop gain for Δω, the phase errors of the PLL2 unit 200 and PLL3 unit 300 can be ignored. Therefore, the phase error of the PLL1 unit 100 becomes the phase error of the whole multiloop.

Thus, the dependence of the phase error on the PLL1 unit 100 means that other PLL basic characteristics associated with direct-current operations such as pull-in/hold-in characteristics and settling characteristics all depend on the PLL1 unit 100.

Figure 1:
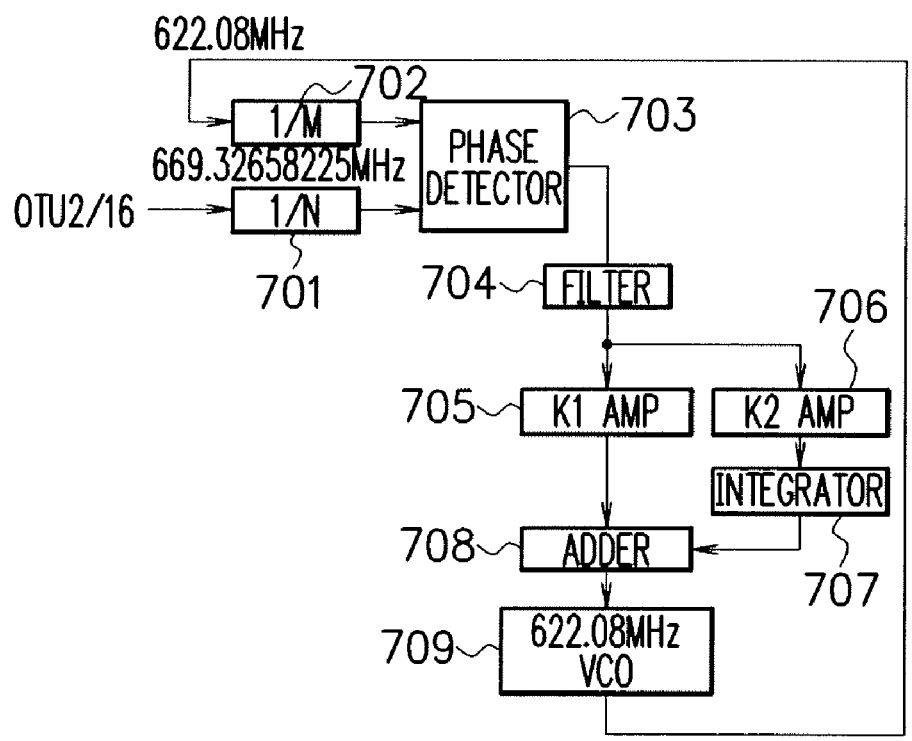
FIG. 1 shows an example of a conventional complete integral type PLL circuit.
Figure 2:
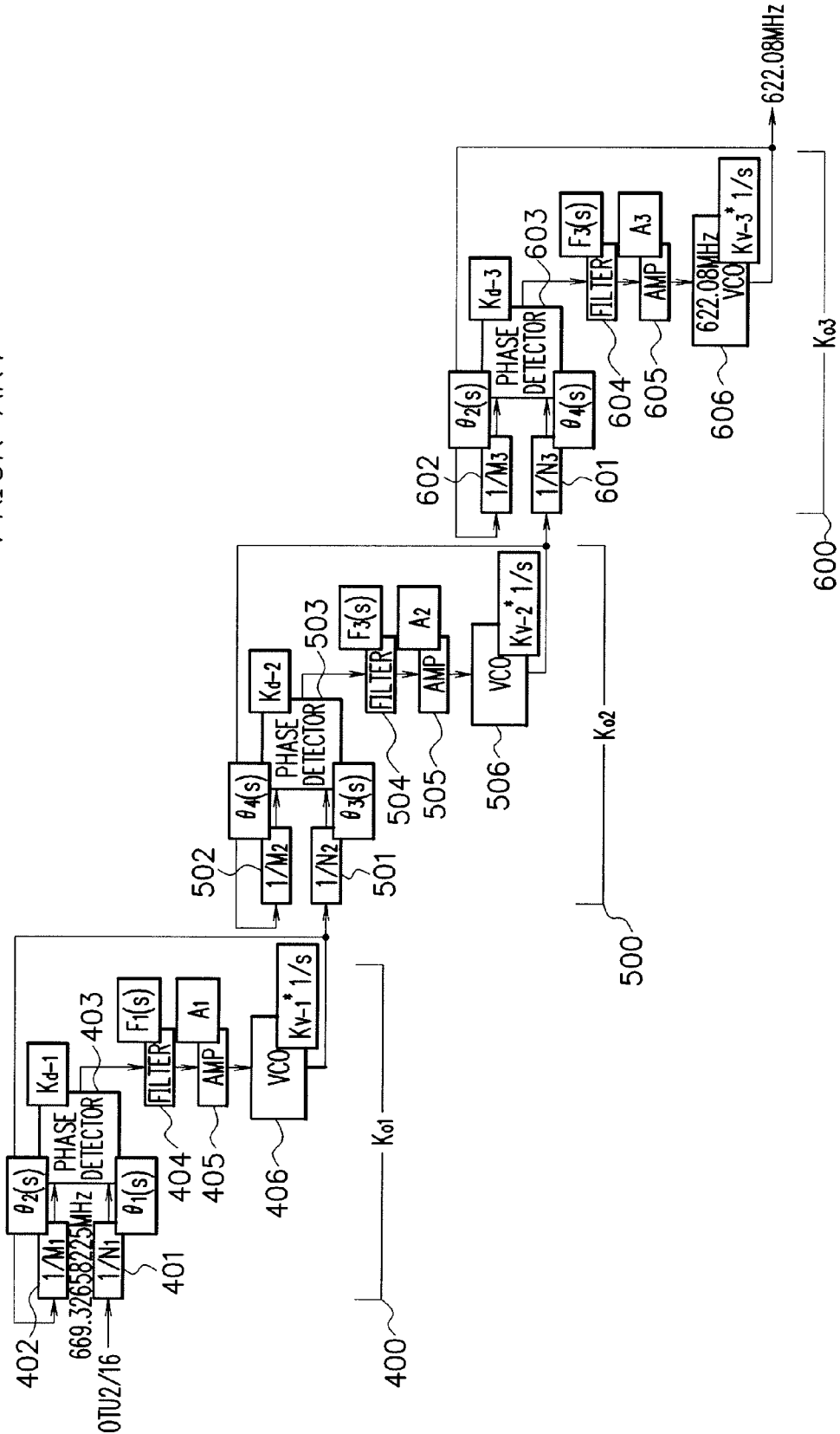
FIG. 2 shows an example of a conventional incomplete integral type PLL circuit.

According to the first embodiment, small scale incomplete integral type PLL circuits shown in FIG. 2 are not connected to form the multiple-stage configuration (cascade configuration), but incomplete integral type PLL circuits are connected to form the multiloop synthesizer configuration as shown in FIG. 3. Therefore, since the basic characteristics of the incomplete integral type PLL circuit are determined only by the PLL1 unit 100, both the high-frequency jitter component and the low-frequency wander component can simultaneously be suppressed while a phase error is reduced.

Then, a second embodiment of the invention will be described in detail with reference to the drawings.

Referring to FIG. 6, the circuit of the second embodiment differs from the circuit of the first embodiment in that a phase monitor unit 150 and an amplifier controller unit 151 are added to the circuit of the first embodiment. The phase monitor unit 150 monitors a phase states of each PLL circuit, and the amplifier controller unit 151 sets an optimum amplifier gain constant for a phase state known from the phase monitor unit 150. In the second embodiment, because the other basic configurations are similar to those of the PLL circuits of the first embodiment, the overlapping descriptions will be omitted.

Then, a specific control flow of the PLL circuit in the second embodiment will be described with reference to FIG. 7.

As described above, the PLL1 unit 100 is dominant in the phase error Ess in the multiloop synthesizer configuration. However, in a transient state, the phase errors of the PLL2 unit 200 and PLL3 unit 300 also have an influence on the multiloop synthesizer configuration as shown in FIG. 9.

Therefore, when the phase errors of "PLL1 unit 100"+"PLL2 unit 200"+"PLL3 unit 300", which are the transient phase error of the whole multiloop, are equal to or more than a phase comparison period of the phase detector unit 103 in the PLL1 unit 100 (S501), an amplifier gain constant is computed in the range where the phase error of the whole multiloop does not exceed the phase comparison period (S502), and the computed amplifier gain constant is set at the amplifier unit 105, the amplifier unit 205, and the amplifier unit 305 of the PLL circuits (S503).

After the amplifier gain constant is set, because the phase error of the whole multiloop returns to the phase error of the PLL1 unit 100 (S505), control is performed such that the amplifier gain constant returns to the original magnification in a stepwise manner (S506).

At this point, when the phase error of the whole multiloop exceeds the phase comparison period again, the amplifier gain constant is set again (S504 and S501).

A method of avoiding multiloop slip will be described below based on a specific example. The direct-current loop gain Ko1 is set at "1000" and a phase comparison period PCt1 is set at "3 μs" in the PLL1 unit 100, the direct-current loop gain Ko2 is set at "0.5" and a phase comparison period PCt2 is set at "125 μs" in the PLL2 unit 200, and the direct-current loop gain Ko3 is set at "2" and a phase comparison period PCt3 is set at "125 μs" in the PLL3 unit 300.

For example, when a 20-ppm rapid fluctuation is generated in the PLL circuit input frequency of the multiloop synthesizer configuration, a phase error Ess1 of 20 ns (=20 ppm/1000) is transiently generated in the PLL1 unit 100, a phase error Ess2 of 40 μs (=20 ppm/0.5) is transiently generated in the PLL2 unit 200, and a phase error Ess3 of 10 μs (=20 ppm/2) is transiently generated in the PLL3 unit 300. The sum of Ess1, Ess2, and Ess3 largely exceeds the phase comparison period of 3 μs of the PLL1 unit 100, which causes a slip state in the whole multiloop.

In order to avoid the PLL slip state, when the phase error of the whole multiloop becomes 3 μs, the amplifier gain constant is set taking into account the direct-current loop gains Ko1, Ko2, and Ko3 of the PLL units, and amplifier control is performed such that the phase error of the whole multiloop does not exceed 3 μs. At this point, the specific amplifier gain constant is computed not lower than 16.67333333 as follows:

$$3\mu s \geq \frac{20\,ppm}{1000 \cdot Amp_{Factor}} + \frac{20\,ppm}{0.5 \cdot Amp_{Factor}} + \frac{20\,ppm}{2 \cdot Amp_{Factor}} \quad \text{[Formula 6]}$$

$$3\mu s \geq \frac{20\,ppm \times 0.5 \times 2 + 20\,ppm \times 1000 \times 2 + 20\,ppm \times 1000 \times 0.5}{Amp_{Factor}(1000 \times 0.5 \times 2)}$$

$$3\mu s \geq \frac{50.02}{Amp_{Factor}}$$

$$Amp_{Factor} \geq 16.67333333$$

Then, a phase relationship in the case where the fluctuation is rapidly generated in the input frequency of the PLL unit having the multiloop synthesizer configuration will be described.

FIG. 9 shows a phase relationship when the input frequency of the PLL circuit is rapidly changed by 20 ppm.

As shown in FIG. 9, in the transient period, the phase θ2(s) of the whole multiloop is not formed by the phase error Ess1 (ϕ3) only but by the sum (ϕ2) of all the phase errors (Ess1+Ess2+Ess3).

Figure 7:
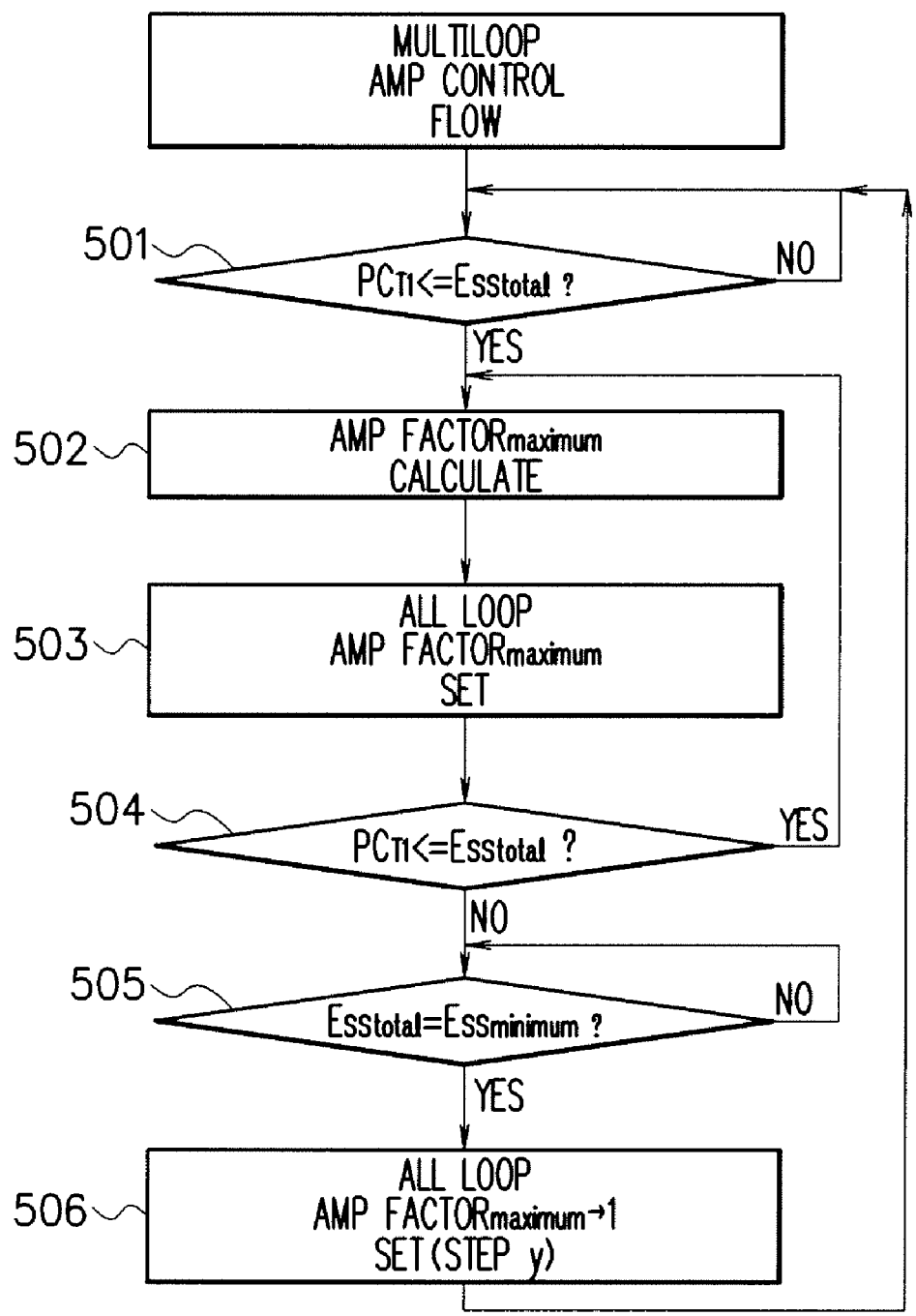
FIG. 7 is a flow chart for control of the PLL circuit in the second embodiment of the invention.
Figure 8:
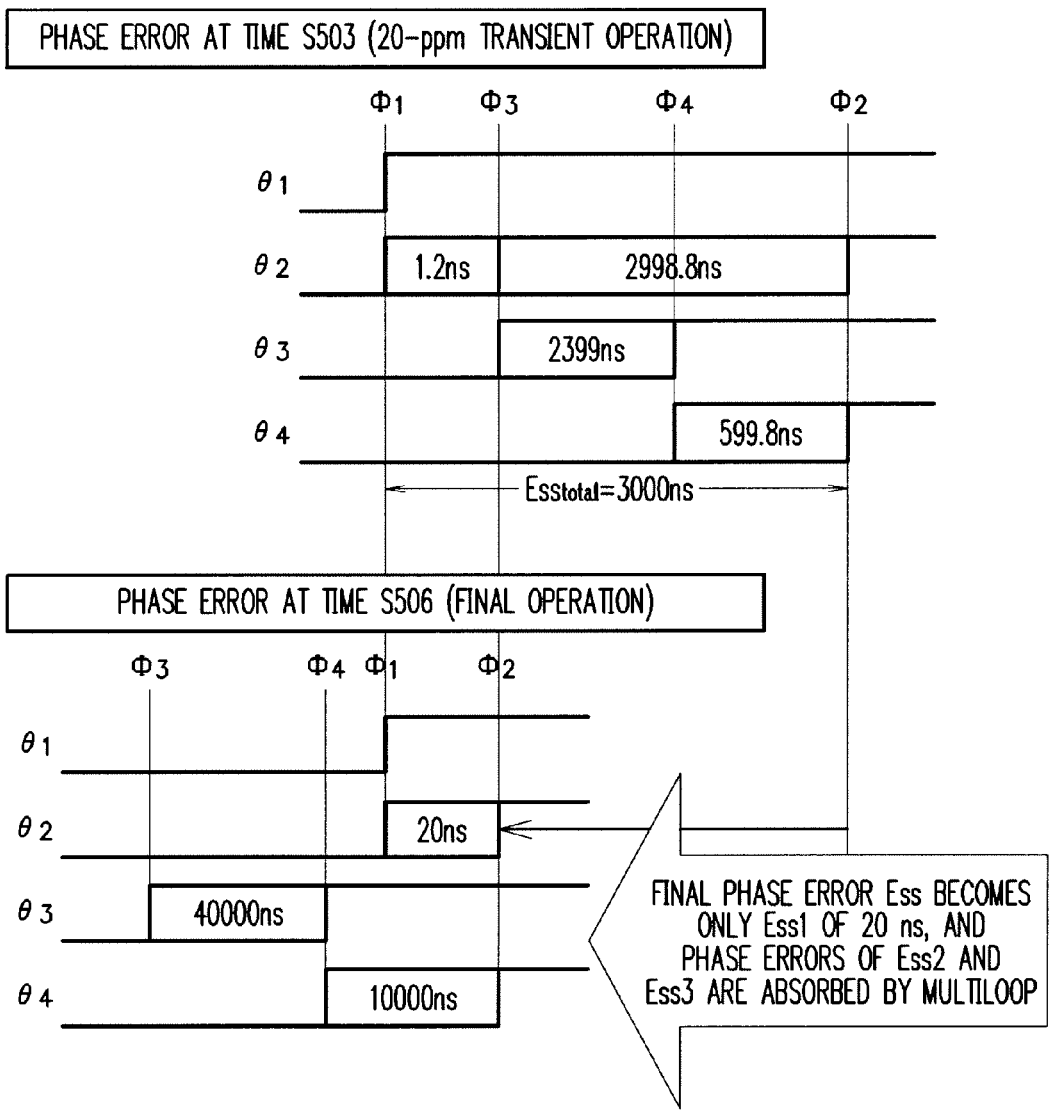
FIG. 8 shows a phase error in the second embodiment of the invention.

However, the phase θ2(s) of the whole multiloop shown in FIG. 8 can be returned to the phase error Ess1 (ϕ3) without PLL slip by performing amplifier gain control as shown in FIG. 7.

As a summary of the explanation so far, FIG. 10 shows a list of parameters used in the control flow of FIG. 7. Although only the amplifier gain control of the whole multiloop (PLL1 unit 100) is described in the above description, actually the same amplifier gain control flow is required for both the PLL2 unit 200 and the PLL3 unit 300.

According to the second embodiment, when the frequency fluctuation and the phase fluctuation are rapidly generated in the input of the PLL circuit, in the transient state, even if the phase errors of the PLL2 unit 200 and PLL3 unit 300 emerge instantly to exceed the phase comparison period in the phase detector unit 103 of the PLL1 unit 100 while incomplete integral type PLL circuit composes the multiloop synthesizer configuration, the PLL slip state is not generated in the whole multiloop, and the circuit stability can always be secured.

The invention is not limited to the above preferred embodiments, but various changes and modifications could be made without departing from the scope of the invention. For example, the PLL circuit function of the invention may be realized by causing the devices to read and execute a program for realizing the PLL circuit function in the embodiment. Further, the program may be transmitted to another computer system through a computer-readable recording medium such as CD-ROM and a magnetic-optical disk or through a transmission medium such as the Internet and a telephone line.

In the above embodiments, the functions of the PLL circuits are realized as one system. However, the invention can also be applied to a configuration in which information processing apparatuses and the like are added corresponding to each function.

What is claimed is:

1. A circuit comprising:
   a first PLL unit which is a high-frequency jitter suppression unit providing a first signal output;
   a second PLL unit receiving said first signal output and which is a low-frequency wander suppression unit providing a second signal output; and
   a third PLL unit receiving said second signal output and which is a reproduction clock unit providing a third signal output, the third signal output being fed back to the first PLL unit so that the first to third PLL units are connected to form a multiloop synthesizer configuration.

2. The circuit according to claim 1, wherein the first PLL unit includes:
   a first 1/N unit which divides a reference clock into a phase comparison frequency;

a first 1/M unit which divides a multiloop clock from the third PLL unit into the phase comparison frequency;

a first phase detector unit which performs a phase comparison process;

a first amplifier unit which amplifies a direct-current component; and a first VCO unit which controls an output frequency by a direct-current signal, the second PLL unit includes:

a second 1/N unit which divides a signal from the first PLL unit into the phase comparison frequency;

a second 1/M unit which divides a generation clock of the second PLL unit into the phase comparison frequency;

a second phase detector unit which performs the phase comparison process;

a second amplifier unit which amplifies the direct-current component; and a second VCO unit which controls the output frequency by the direct-current signal, and the third PLL unit includes:

a third 1/N unit which divides a signal from the second PLL unit into the phase comparison frequency;

a third 1/M unit which divides a generation clock of the third PLL unit into the phase comparison frequency;

a third phase detector unit which performs the phase comparison process;

a third amplifier unit which amplifies the direct-current component; and a third VCO unit which controls the output frequency by the direct-current signal.

3. The circuit according to claim 2, further comprising:

a phase monitor unit which monitors phase states of the first PLL unit, the second PLL unit, and the third PLL unit; and an amplifier controller unit which sets an optimum amplifier gain constant based on phase state information from the phase monitor unit, wherein, when the amplifier controller unit determines that a phase error of the whole multiloop is equal or more than a phase comparison period of the first phase detector unit by comparing the phase error to the phase comparison period based on the phase state information from the phase monitor unit, an amplifier gain constant is computed in a range where the phase error of the whole multiloop does not exceed the phase comparison period, and the amplifier gain constant is set at the first amplifier unit, the second amplifier unit, and the third amplifier unit.

4. A control system comprising:

a first PLL unit which is a high-frequency jitter suppression unit providing a first signal output;

a second PLL unit receiving said first signal output and which is a low-frequency wander suppression unit providing a second signal output; and a third PLL unit receiving said second signal output and which is a reproduction clock unit providing a third signal output, the third signal output being fed back to the first PLL unit so that the first to third PLL units are connected to form a multiloop synthesizer configuration.

5. The control system according to claim 4, wherein the first PLL unit includes:

a first 1/N unit which divides a reference clock into a phase comparison frequency;

a first 1/M unit which divides a multiloop clock from the third PLL unit into the phase comparison frequency;

a first phase detector unit which performs a phase comparison process;

a first amplifier unit which amplifies a direct-current component; and a first VCO unit which controls an output frequency by a direct-current signal, the second PLL unit includes:

a second 1/N unit which divides a signal from the first PLL unit into the phase comparison frequency;

a second 1/M unit which divides a generation clock of the second PLL unit into the phase comparison frequency;

a second phase detector unit which performs the phase comparison process;

a second amplifier unit which amplifies the direct-current component; and a second VCO unit which controls the output frequency by the direct-current signal, and the third PLL unit includes:

a third 1/N unit which divides a signal from the second PLL unit into the phase comparison frequency;

a third 1/M unit which divides a generation clock of the third PLL unit into the phase comparison frequency;

a third phase detector unit which performs the phase comparison process;

a third amplifier unit which amplifies the direct-current component; and a third VCO unit which controls the output frequency by the direct-current signal.

6. The control system according to claim 5, further comprising:

a phase monitor unit which monitors phase states of the first PLL unit, the second PLL unit, and the third PLL unit; and an amplifier controller unit which sets an optimum amplifier gain constant based on phase state information from the phase monitor unit, wherein, when the amplifier controller unit determines that a phase error of the whole multiloop is equal or more than a phase comparison period of the first phase detector unit by comparing the phase error to the phase comparison period based on the phase state information from the phase monitor unit, an amplifier gain constant is computed in a range where the phase error of the whole multiloop does not exceed the phase comparison period, and the amplifier gain constant is set at the first amplifier unit, the second amplifier unit, and the third amplifier unit.

7. The circuit according to claim 1 implemented as an IC.

8. The circuit according to claim 1 incorporated in a transmitting and receiving apparatus.

9. A control method under a multiloop synthesizer configuration that is formed by a first PLL unit which is a high-frequency jitter suppression unit, a second PLL unit which is a low-frequency wander suppression unit and a third PLL unit which is a reproduction clock unit, the method in the first PLL unit comprising the steps of:

dividing a reference clock into a phase comparison frequency with a first 1/N unit;

dividing a multiloop clock from the third PLL unit into the phase comparison frequency with a first 1/M unit;

performing a phase comparison process with a first phase detector unit;

amplifying a direct-current component with a first amplifier unit; and controlling an output frequency by a direct-current signal with a first VCO unit, the method in the second PLL unit comprising the steps of:

dividing a signal from the first PLL unit into the phase comparison frequency with a second 1/N unit;
dividing a generation clock of the second PLL unit into the phase comparison frequency with a second 1/M unit;
performing the phase comparison process with a second phase detector unit;
amplifying the direct-current component with a second amplifier unit; and
controlling the output frequency by the direct-current signal with a second VCO unit, and
the method in the third PLL unit comprising the steps of:
dividing a signal from the second PLL unit into the phase comparison frequency with a third 1/N unit;
dividing a generation clock of the third PLL unit into the phase comparison frequency with a third 1/M unit;
performing the phase comparison process with a third phase detector unit;
amplifying the direct-current component with a third amplifier unit; and
controlling the output frequency by the direct-current signal with a third VCO unit.

10. The control method according to claim 9, wherein the multiloop synthesizer configuration further comprises a phase monitor unit which monitors phase states of the first PLL unit, the second PLL unit, and the third PLL unit, and an amplifier controller unit which sets an optimum amplifier gain constant based on phase state information from the phase monitor unit, wherein, when the amplifier controller unit determines that a phase error of the whole multiloop is equal or more than a phase comparison period of the first phase detector unit by comparing the phase error to the phase comparison period based on the phase state information from the phase monitor unit, an amplifier gain constant is computed in a range where the phase error of the whole multiloop does not exceed the phase comparison period, and the amplifier gain constant is set at the first amplifier unit, the second amplifier unit, and the third amplifier unit.

11. A program implemented on a computer-readable recording medium for a first PLL unit, a second PLL unit and a third PLL unit, the first PLL unit being a high-frequency jitter suppression unit, the second PLL unit being a low-frequency wander suppression unit, the third PLL unit being a reproduction clock unit, the first to third PLL units being connected to form a multiloop synthesizer configuration, the program causes the first PLL unit to execute the following:
dividing a reference clock into a phase comparison frequency with a first 1/N unit;
dividing a multiloop clock from the third PLL unit into the phase comparison frequency with a first 1/M unit;
performing a phase comparison process with a first phase detector unit;
amplifying a direct-current component with a first amplifier unit; and
controlling an output frequency by a direct-current signal with a first VCO unit,
the program causes the second PLL unit to execute the following:
dividing a signal from the first PLL unit into the phase comparison frequency with a second 1/N unit;
dividing a generation clock of the second PLL unit into the phase comparison frequency with a second 1/M unit;
performing the phase comparison process With a second phase detector unit;
amplifying the direct-current component with a second amplifier unit; and
controlling the output frequency by the direct-current signal with a second VCO unit, and
the program causes the third PLL unit to execute the following:
dividing a signal from the second PLL unit into the phase comparison frequency with a third 1/N unit;
dividing a generation clock of the third PLL unit into the phase comparison frequency with a third 1/M unit;
performing the phase comparison process with a third phase detector unit;
amplifying the direct-current component with a third amplifier unit; and
controlling the output frequency by the direct-current signal with a third VCO unit.

12. The program implemented on a computer-readable recording medium according to claim 11, wherein the program causes an amplifier controller unit to execute a process in which an amplifier gain constant is computed in a range where a phase error of the whole multiloop does not exceed a phase comparison period and the amplifier gain constant is set at the first amplifier unit, the second amplifier unit, and the third amplifier unit, when the amplifier controller unit determines that the phase error of the whole multiloop is equal or more than the phase comparison period of the first phase detector unit by comparing the phase error to the phase comparison period based on phase state information from a phase monitor unit which monitors phase states of the first PLL unit, the second PLL unit, and the third PLL unit.

* * * * *